(12) United States Patent
Yokota

(10) Patent No.: US 6,604,011 B2
(45) Date of Patent: Aug. 5, 2003

(54) RETICLE CHUCK IN EXPOSURE APPARATUS AND SEMICONDUCTOR DEVICE MANUFACTURING METHOD USING THE SAME

(75) Inventor: Yukihiro Yokota, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 19 days.

(21) Appl. No.: 09/862,590

(22) Filed: May 23, 2001

(65) Prior Publication Data

US 2002/0013069 A1 Jan. 31, 2002

(30) Foreign Application Priority Data

May 24, 2000 (JP) ........................................ 2000-152340

(51) Int. Cl.[7] .............................................. G06F 19/00
(52) U.S. Cl. ........................ 700/108; 700/112; 700/116
(58) Field of Search ............................ 118/728; 269/21; 355/18, 78, 94; 700/108, 116, 112

(56) References Cited

U.S. PATENT DOCUMENTS

| 3,645,622 | A | * | 2/1972 | Cachon et al. ............... 355/94 |
| 3,711,082 | A | * | 1/1973 | Seidenfaden ................. 269/21 |
| 3,804,397 | A | * | 4/1974 | Neumann ..................... 269/21 |
| 4,357,006 | A | * | 11/1982 | Hayes .......................... 269/21 |
| 4,564,284 | A | * | 1/1986 | Tsutsui ........................ 355/91 |
| 4,609,285 | A | * | 9/1986 | Samuels ....................... 355/53 |
| 5,355,320 | A | * | 10/1994 | Erjavic et al. ................ 700/97 |
| 5,553,837 | A | * | 9/1996 | Kahle ........................... 269/21 |
| 5,691,895 | A | * | 11/1997 | Kurtzberg et al. .......... 700/108 |

* cited by examiner

*Primary Examiner*—Leo Picard
*Assistant Examiner*—Walter Russell Swindell
(74) *Attorney, Agent, or Firm*—Fitzpatrick, Cella, Harper & Scinto

(57) ABSTRACT

An original chuck for holding an original includes a plurality of attracting and holding portions for holding the original, each of the plurality of attracting and holding portions having a supporting member for supporting the original with point contact, and an attracting pad of an elastic material for surrounding the supporting member. The original chuck also includes an adjusting mechanism for adjustably moving at least one of the attracting and holding portions in a direction orthogonal to a supporting surface of a respective supporting member.

12 Claims, 12 Drawing Sheets

BEFORE ADJUSTMENT OF
HOLDING PORTION 3d

AFTER ADJUSTMENT OF
HOLDING PORTION 3d

TO VACUUM SOURCE

RETICLE CHUCK IN EXPOSURE APPARATUS AND SEMICONDUCTOR DEVICE MANUFACTURING METHOD USING THE SAME

FIELD OF THE INVENTION AND RELATED ART

This invention relates to an original chuck for holding an original such as a reticle, for example. Such an original chuck is usable, for example, in an exposure apparatus for transferring a pattern of an original such as a reticle onto a substrate such as a wafer, in a photolithographic process for the manufacture of semiconductor integrated circuits, liquid crystal substrates, or image pickup devices (CCDs), for example.

Exposure apparatuses such as described above are an apparatus in which an original such as a reticle being attracted by an original chuck, for holding the original, is illuminated and in which a pattern formed on the original is projected on a substrate such as a wafer, by a projection optical system and in a reduced scale, whereby the pattern of the original is transferred to the substrate. The original such as a reticle is conveyed to and placed on the original chuck by means of an original conveying system. Then, the original is attracted to an attracting face of original attracting and holding means, provided on the top face of the original chuck.

Generally, original chucks such as described above have a structure as shown in FIGS. 10A–10C. More specifically, an original chuck 51 includes a main chucking body 52 which has four attracting and holding portions 53 (53a–53d) disposed in relation to four corners of an original R. As shown in FIG. 10C, each attracting and holding portion 53 includes a holding pillar 54 which has formed on its top end face a planar original attracting face 56 having a certain area and being formed with an attracting groove 55. The attracting groove 55 is communicated with a vacuum source, not shown, through an attracting bore 57. With this structure, the original chuck 51 functions to vacuum-attract and hold the four corners of the original R (at the bottom face thereof) as the same is placed on the original attracting faces 56 of the four attracting and holding portions 53.

However, it is very difficult to make all four of the original attracting faces 56, for attracting the original R, completely on the same plane. Practically, in many cases, these original attracting faces 56 are inclined differently or they have different heights, such that they are not placed exactly on the same plane. If, for example, an original attracting face 56 is inclined such as depicted by a broken line in FIG. 10C, the original R follows the tilt surface shape of this attracting face 56, and therefore it is attracted and held in such a tilted state.

In this manner, the original R may be deformed, such as depicted in FIGS. 11A–11D, for example, in accordance with the state of the original attracting faces 56 of the attracting and holding portions 53. For example, as shown in FIG. 11A, it may be distorted and protruded downwardly, or, to the contrary, it may be distorted and protruded upwardly as shown in FIG. 11B. Alternatively, it may be deformed into an S-shape as shown in FIG. 11C. The deformation shown in FIG. 11A may occur when the attracting faces at the opposite sides are tilted inwardly downwardly. The deformation shown in FIG. 11B may occur when the attracting faces at the opposite sides are tilted inwardly upwardly. The deformation shown in FIG. 11C may occur when one attracting face is tilted inwardly downwardly, while the other attracting face is tilted inwardly upwardly.

The result shown in FIG. 11D may occur when the original attracting faces 56a and 56d of the attracting and holding portions 53a and 53d are taller than the original attracting faces 56b and 56c of the other attracting and holding portions 53b and 53c. As shown, the portions of the original adjacent to the original attracting faces 56a and 56d are distorted upwardly. Deformation as shown in FIG. 11D which is attributable to differences in height of the original attracting faces 56 may be disregarded if, for example, the number of the original attracting portions is made three. However, when the shape of the original and the exposure pattern placement area are taken into consideration, holding a substrate such as a wafer at three equiangular positions on the same circumference about the center, where deformation due to the weight thereof hardly occurs, is impossible.

Anyway, the tendency and the magnitude of deformation of the original R are variable in dependence upon the shape of the original attracting faces or the difference in height of the original attracting faces. In accordance with the tendency and the amount of deformation, distortion may occur in the pattern of the original R such as, for example, shown in FIGS. 12A–12D, which correspond to the cases of FIGS. 11A–11D, respectively. In FIGS. 12A–12D, the orientation and size of each arrow depicts a shift of a pattern at each grid point of an idealistic grid (grid without distortion), shown by broken lines. As a result, the pattern formed on the original R which is being distorted as described is transferred to a substrate such as a wafer. Namely, the transferred pattern is undesirably being distorted.

Generally, a semiconductor device is produced by accumulating circuit patterns of plural layers on a substrate such as a wafer, in a predetermined positional relation. In recent semiconductor manufacturing factories, for higher throughput (the number of wafers processed per unit time), in many cases, the exposure process is performed in accordance with a mix and match method in which different exposure apparatuses are used for different layers on the substrate. Here, the surface shapes of original attracting faces of original chucks in these exposure apparatuses may have different tendencies and, therefore, patterns transferred to the substrate such as a wafer may involve different distortions. This causes a problem of an error with respect to the pattern overlay or pattern junction.

The error may be tolerable, conventionally. Recently, however, the precision required for exposure apparatuses becomes higher and higher. It becomes very important to prevent deformation of an original resulting from the surface shape of attracting faces of an original chuck or from the difference in height of the attracting faces, thereby to reduce distortion of a pattern of the original or distortion of a pattern transferred to a substrate such as a wafer.

SUMMARY OF THE INVENTION

It is accordingly an object of the present invention to provide an original chuck, by which deformation of an original such as a reticle when the same is attracted and held by the chuck can be prevented, such that distortion of a pattern of the original or distortion of a pattern transferred to a substrate such as a wafer can be reduced.

It is another object of the present invention to provide an exposure apparatus having an original chuck such as described above.

It is a further object of the present invention to provide a semiconductor device manufacturing method using an exposure apparatus such as described above.

In accordance with an aspect of the present invention, there is provided an original chuck having an attracting and holding portion for holding an original, characterized in that said attracting and holding portion has a contact member to be brought into contact with the original, wherein said contact member has a spherical shape.

In one preferred form of this aspect of the present invention, said attracting and holding portion may have an attracting pad for surrounding said contact member, said attracting pad being made of an elastic material and being effective to attract the original.

In accordance with another aspect of the present invention, there is provided an original chuck having a plurality of attracting and holding portions for holding an original, characterized in that at least one of said attracting and holding portions has an adjusting mechanism for providing adjustment in a vertical direction.

In one preferred form of this aspect of the present invention, said adjusting mechanism may include one of a piezoelectric device, an electrostrictive device and a magnetostrictive device.

Each of said attracting and holding portions may include a contact member to be brought into contact with the original, wherein said contact member may have a spherical shape.

Each of said attracting and holding portions may have an attracting pad for surrounding said contact member, said attracting pad being made of an elastic material and being effective to attract the original.

In accordance with a further aspect of the present invention, there is provided an exposure apparatus, comprising: an original chuck, as recited above, for attracting and holding an original; and exposure means for transferring a pattern of the original, held by said original chuck, onto a substrate by exposure.

In one preferred form of this aspect of the present invention, the exposure apparatus may further comprise a display, a network interface, and a computer for executing a network accessing software program, such that data transmission for maintenance information related to said exposure apparatus can be performed through a computer network.

The network accessing software program may provide, on said display, a user interface for accessing to a maintenance database provided by one of a vendor and a user of said exposure apparatus, such that information can be obtained from said database through an internet connected to the computer network or an exclusive line network.

In accordance with a yet further aspect of the present invention, there is provided a semiconductor device manufacturing method, comprising the steps of: setting a group of production machines, including an exposure apparatus as recited above, in a semiconductor manufacturing factory; and producing semiconductor devices through plural processes using the production machine group.

In one preferred form of this aspect of the present invention, the method may further comprise connecting the production machines of the group with each other by a local area network, and performing data communication related to at least one of the production machines of the group, between the local area network and one of an exclusive line network or an internet, being an exterior network outside the semiconductor manufacturing factory.

The data communication may be one effective to enable that a database which is provided by one of a manufacturer of semiconductor devices or a vendor of a semiconductor production machine is accessed through the exterior network to obtain maintenance information related to the manufacturing apparatus, or alternatively, the data communication may be made between the semiconductor manufacturing factory and another semiconductor manufacturing factory through the external network, for production control.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A–2D show an original chuck according to a first embodiment of the present invention, wherein FIG. 2A is a plan view of the chuck as an original is attracted and held thereby, FIG. 2B is a side view thereof, FIG. 2C is a plan view showing attracting and holding portions of the original chuck, and FIG. 2D is a sectional view of one attracting and holding portion as the original is attracted thereby.

FIGS. 3A–3C show an original chuck according to a second embodiment of the present invention, wherein FIG. 3A is a side view, FIG. 3B is a fragmentary view showing an example of an attracting and holding portion having an upward/downward adjusting function, and FIG. 3C shows another example of an attracting and holding portion being adjustable in upward and downward directions.

FIGS. 10A–10C are schematic views of a conventional original chuck, wherein FIG. 10A is a plan view as an original is attracted and held by the chuck, FIG. 10B is a side view thereof, and FIG. 10C is a fragmentary and sectional view of an attracting and holding portion of the original chuck.

DESCRIPTION OF THE PREFERRED EMBODIMENTS

Preferred embodiments of the present invention will now be described with reference to the accompanying drawings.

Figure 1:
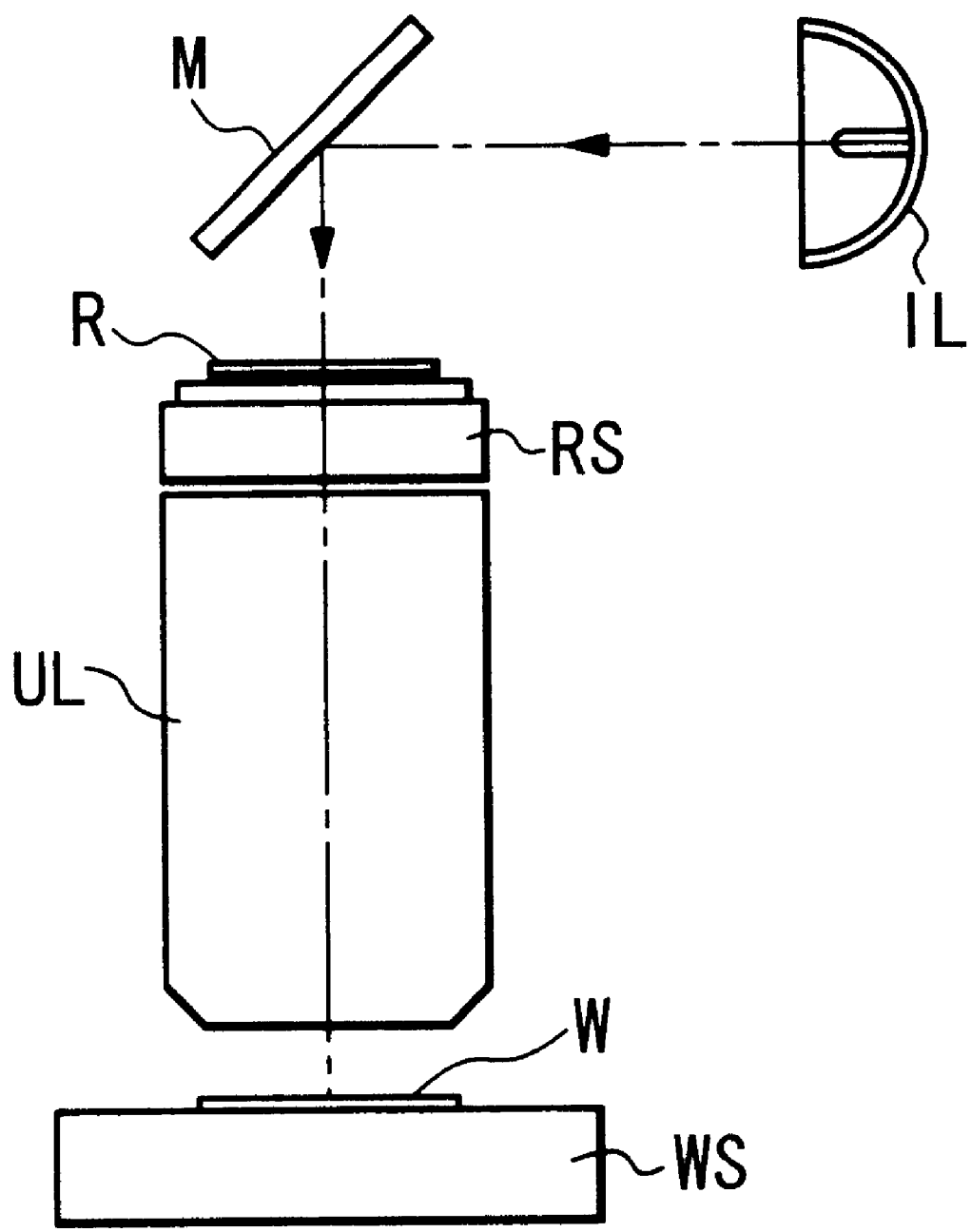
FIG. 1 is a schematic view of an exposure apparatus to which an original chuck according to the present invention is applicable.
Figure 2A:
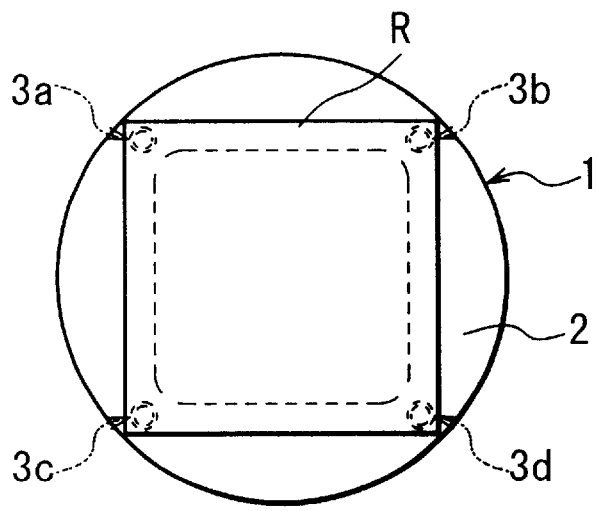
Figure 2B:
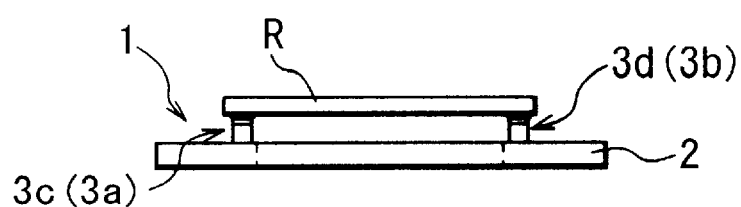
Figure 2C:
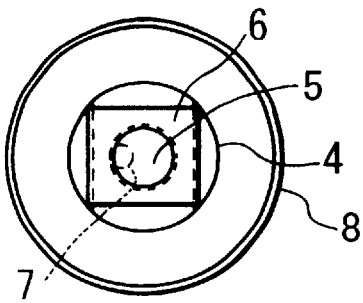
Figure 2D:
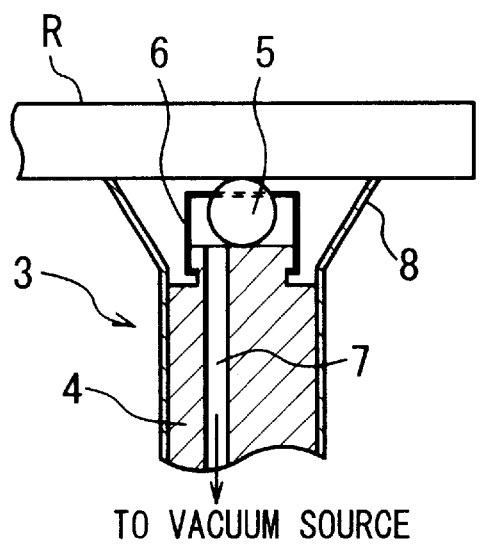

FIG. 1 is a schematic view of a general structure of an exposure apparatus into which an original chuck according to the present invention can be incorporated. FIGS. 2A–2D show an original chuck according to an embodiment of the present invention. FIG. 2A is a plan view of the chuck as an original is attracted and held thereby, and FIG. 2B is a side view thereof. FIG. 2C is a plan view showing attracting and holding portions of the original chuck, and FIG. 2D is a sectional view of one attracting and holding portion as the original is attracted thereby.

The exposure apparatus shown in FIG. 1 is a step-and-repeat type exposure apparatus in which a pattern of an original such as a reticle, for example, is printed, by simultaneous exposure, on each shot region on a substrate such as a wafer, for example, through a projection optical system. Denoted at IL is a light source for emitting light of a short wavelength. Denoted at R is an original such as a reticle on which a pattern is formed. The original R is placed on an original stage RS. Denoted at UL is a projection optical system. Denoted at W is a substrate such as a wafer, for example, which is the subject to be exposed. The substrate W is placed on a substrate stage WS, and the substrate stage WS is arranged to move the substrate W to an exposure station. Illumination light emitted by the light source IL is transformed by an illumination optical system (not shown) into a light flux having a uniform illumination distribution. It is then reflected by a reflection mirror M to illuminate the original R, being placed on the original stage RS. The pattern of the original R is then transferred to each shot region on the substrate W, placed on the substrate stage WS, through the projection optical system UL.

The original R is moved and placed on an original chuck 1 (see FIG. 2) provided on the original stage RS, by means of an original conveying system (not shown), and it is held by the chuck through vacuum attraction. The original stage RS is made movable on the basis of an original reference mark (not shown), for good precision positioning of the original R.

As best seen in FIGS. 2A and 2B, the original chuck 1 includes four attracting and holding portions 3 (3a–3d), mounted on a chuck main body 2, to attract the original R at four corners thereof. As best seen in FIGS. 2C and 2D, each attracting and holding portion 3 includes a holding pillar 4 mounted on the chuck main body 2, as well as a steel ball 5 disposed at the center of the top end face of the holding pillar 4, to be engaged against the original R. The steel ball 5 is attached to the holding pillar 4 by means of a fixing member 6 which functions to hold the steel ball 5 rotatably and to restrict lateral motion of the steel ball 5. The holding pillar 4 has an attracting bore 7 being communicated with a vacuum source, not shown. The attracting bore 7 is formed off the central axis of the holding pillar 4. Further, there is an attracting pad 8 made of an elastic material such as rubber, for example. The pad 8 is attached to the side face of the holding pillar 4 so as to surround the steel ball 5.

The attracting and holding portion 3 of the structure described above functions to support the original R, by point contact through the steel ball 5. Also, as a negative pressure is produced inside the attracting pad 8 through the attracting groove 7 in response to the operation of the vacuum source (not shown), the original R is attracted by the attracting pad 8. Namely, the original R is attracted by the elastic-material attracting pads 8 while, on the other hand, it is supported by the vertexes of the steel balls 5. In this manner, the original R is attracted and held by the chuck while being supported through point contact. In this embodiment, therefore, the original R can be attracted and held without being influenced by the shape of the attracting face, as in the conventional example wherein the original is held by an attracting face with a suction groove. Consequently, it does not produce deformation of the original due to the influence of the shape of the attracting face. This ensures that distortion of a pattern of the original due to the deformation of the original is prevented, and also that distortion of a pattern transferred to a substrate such as a wafer is prevented.

Referring now to FIGS. 3A–3C and 4A–4D, an original chuck according to a second embodiment of the present invention will be described. In this embodiment, the components similar to those of the preceding embodiment are denoted by the same reference numerals.

Figure 3A:
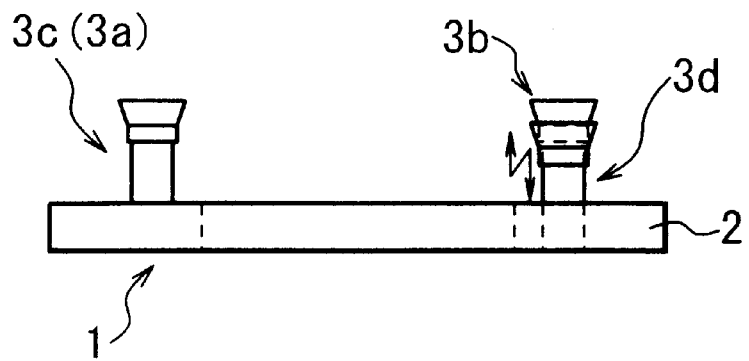

In the original chuck of this embodiment, four attracting and holding portions are disposed in a similar manner as the preceding embodiment, and at least one of these attracting and holding portions is equipped with a function for adjustability in upward and downward directions. More specifically, in this embodiment, as best seen in FIG. 3A, the original chuck 1 includes four attracting and holding portions 3a–3d, and among them, three attracting and holding portions 3a–3c are non-adjustable. The remaining one attracting and holding portion 3d is made adjustable in upward and downward directions.

Figure 3B:
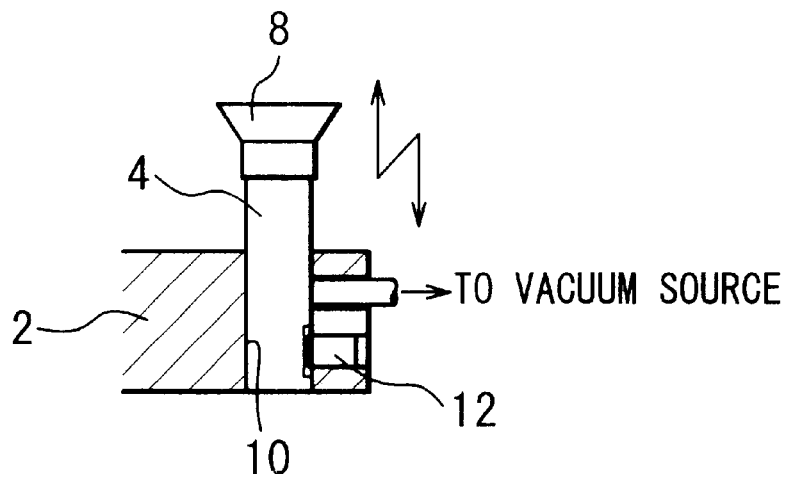

As regards the upward and downward adjusting mechanism for the attracting and holding portion 3d, an example is shown in FIG. 3B wherein the holding pillar 4 of the attracting and holding portion 3 is inserted into a mounting bore 10 of the chuck main body 2, for movement in upward and downward directions. The position of the holding pillar in the vertical direction is adjusted appropriately and, after it, a fixing screw 12 is tightened to secure the holding pillar 4 with respect to the chuck main body 2. With this arrangement, the position of the attracting and holding portion 3 (i.e., the position for supporting the original) is made adjustable with respect to the vertical direction.

Figure 3C:
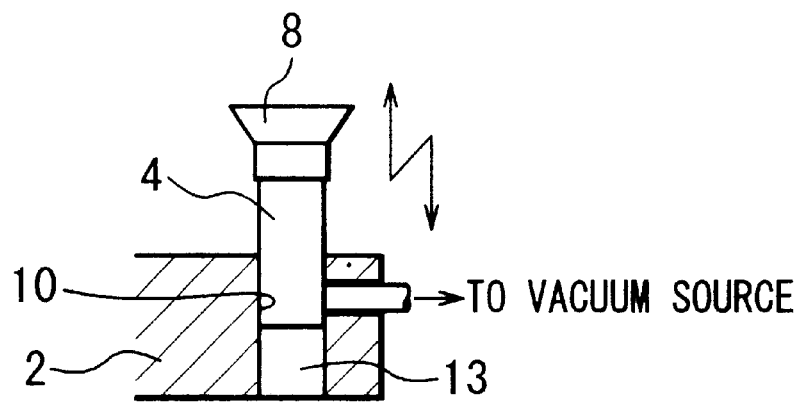

FIG. 3C shows another example wherein the holding pillar 4 of the attracting and holding portion 3 is inserted into the mounting bore 10 of the chuck main body 2, for movement in upward and downward directions. Additionally, a piezoelectric device 13 is provided to engage with the lower end portion of the holding pillar 4. By actuating the piezoelectric device 13, the position of the attracting and holding portion 3 (i.e., the position for supporting the original) can be adjusted with respect to the vertical direction. The remaining portion of the attracting and holding portion 3 may preferably be of the same structure as that of the preceding embodiment.

Referring now to FIGS. 4A–4D, the adjusting function of such an original chuck, having a vertically adjustable attracting and holding portion, will be explained.

Figure 4A:
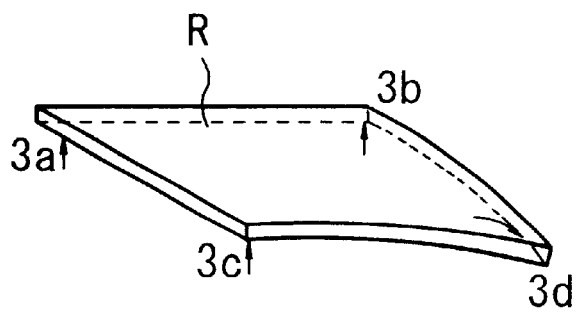
FIGS. 4A–4D are schematic views for explaining the upward and downward adjustment function of the original chuck, in the second embodiment of the present invention.
Figure 4B:
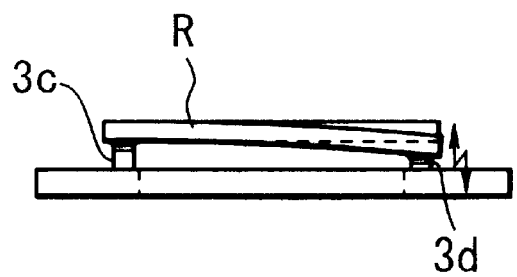
Figure 4C:
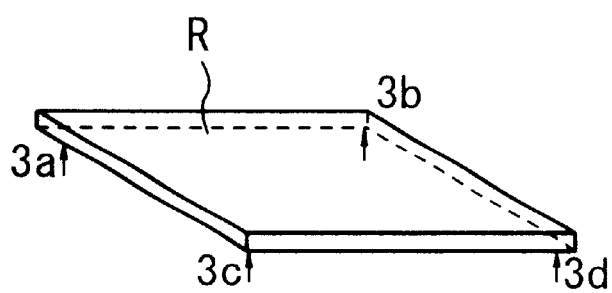
Figure 4D:
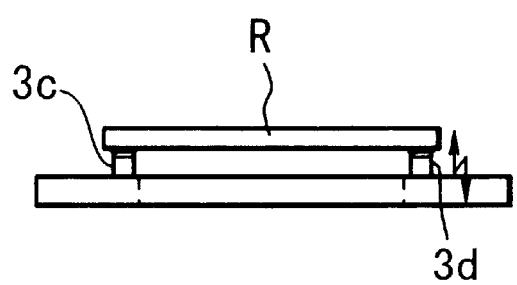

As an original is attracted and held by an original chuck according to this embodiment, as shown in FIGS. 4A and 4B, the attracting and holding portion 3d being adjustable in upward and downward directions may be set at a height lower than the other attracting and holding portions 3a–3c, and the original R may be attracted and held by the three fixed attracting and holding portions 3a–3c. On that occasion, particularly when the portion (member) to be brought into contact with the original R is formed with a spherical shape, the original R can be held along an idealistic plane with the three-point support. However, the remaining corner of the original R may be distorted due to the weight thereof (see FIGS. 4A and 4B). In consideration of this, the attracting and holding portion 3d which is adjustable in upward and downward directions is adjustably moved, upwardly, so as to cancel such a distortion component. The attracting and holding portion 3d is then fixed at the position where distortion due to the weight is not produced. In this manner, as shown in FIGS. 4C and 4D, the original R can be held within the same plane, and an adverse influence resulting from a difference in height in the four-point support can be avoided.

As regards the method of position adjustment for the attracting and holding portion 3d being adjustable in upward and downward directions, during an assembling process of the original stage in which the original chuck 1 is incorporated, a reference original R may be placed on the attracting and holding portions 3a–3c and, while checking the flatness of the reference original R by using a laser interferometer, the height (position) of the vertically adjustable attracting and holding portion 3d with respect to the vertical direction may be adjusted.

In the case of the vertically adjustable attracting and holding portion shown in FIG. 3B, the position of the holding pillar 4 in the vertical direction may be adjusted and, then, it may be fixed by means of the fixing screw 12. The height in the vertical position can be adjusted thereby.

In the case of the vertically adjustable attracting and holding portion which uses a piezoelectric device 13, such as shown in FIG. 3C, the adjustment can be done by actuating the piezoelectric device 13. The adjustment can be done on the basis of the result of exposure. For example, correction can be made in accordance with the flatness characteristic peculiar to each original R. The amount of drive of the piezoelectric device in relation to each original R may be stored into a memory and, it may be read out in accordance with the original R to be used, to adjust the adjustable attracting and holding portion. This enables optimum holding for all the originals. The piezoelectric device may of course be replaced by an electrostrictive device or a magnetostrictive device.

In accordance with this embodiment, as described above, the influence due to a difference in height in the four-point support can be avoided, and surface deformation resulting from holding the original can be prevented. Therefore, a distortion of a pattern of the original to be caused by the deformation of the original can be avoided, and also distortion of a pattern transferred to a substrate such as a wafer can be prevented.

Next, an embodiment of a manufacturing system for manufacturing semiconductor devices such as semiconductor chips (e.g., ICs or LSIs), liquid crystal panels, CCDs, thin film magnetic heads, or micro-machines, for example, using an exposure apparatus having an original chuck as described above, will be explained. This system is arranged so that a repair of any disorder occurring in a production machine placed in a semiconductor manufacturing factory or periodic maintenance thereof or, alternatively, a maintenance services such as software supply, can be made by use of a computer network outside the manufacturing factory.

Figure 5:
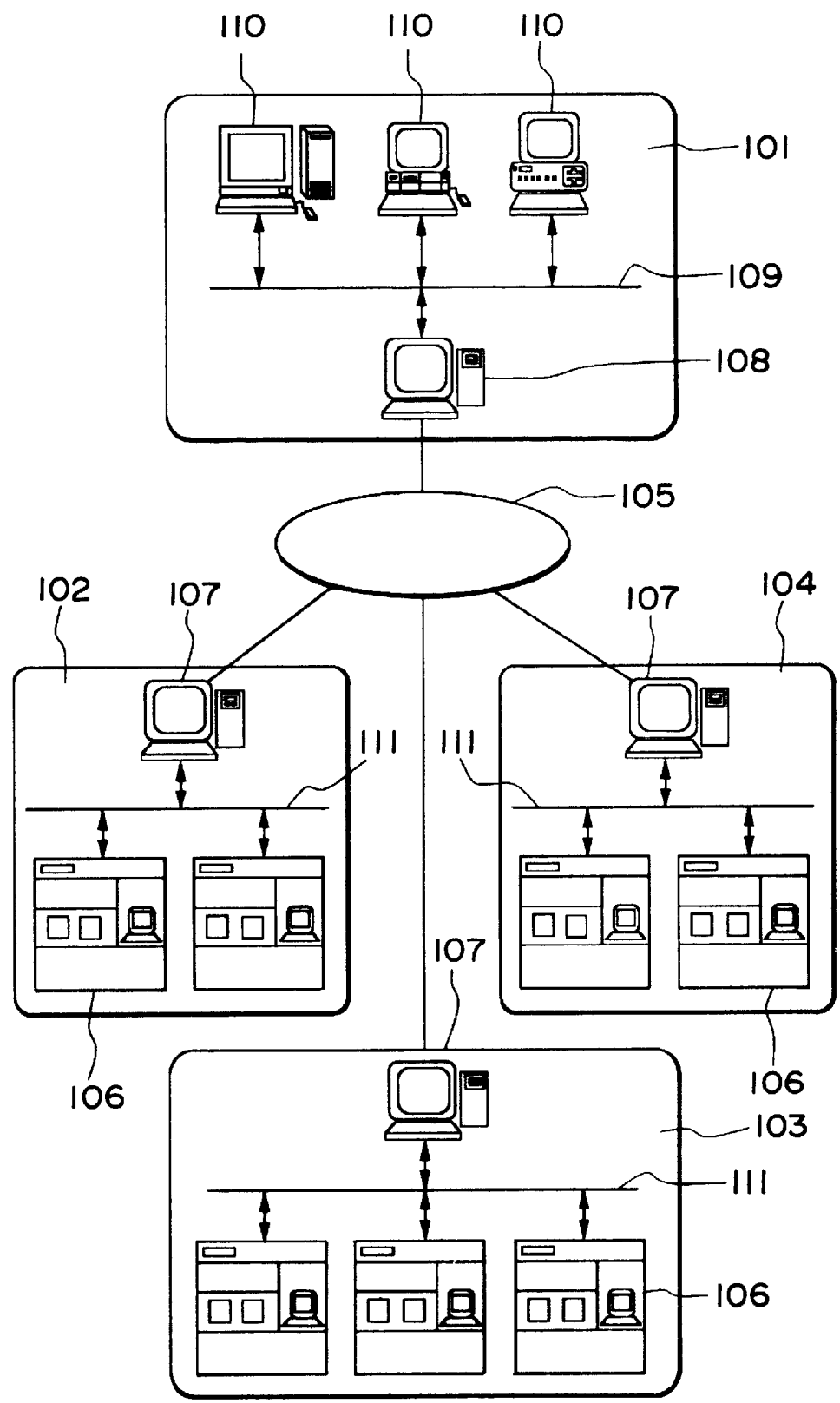
FIG. 5 is a schematic view of a general structure of a semiconductor device manufacturing system.

FIG. 5 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, various semiconductor manufacturing apparatuses to be used in various processes in a semiconductor manufacturing factory, that is, pre-process machines (such as an exposure apparatus, a resist processing apparatus, a heat treatment apparatus, a film forming apparatus, etc.) and post-process machines (an assembling machine and an inspection machine, for example) are assumed. Inside the business office 101, there are a host control system 108 for providing a maintenance database for the production machines, plural operating terminal computers 110, and a local area network (LAN) 109 for connecting them to constitute an intranet. The host control system 108 is provided with a gateway for connecting the LAN 109 to an internet 105 which is an outside network of the office, and a security function for restricting access from the outside.

On the other hand, denoted at 102–104 are plural manufacturing factories of a semiconductor manufacturer or manufacturers as a user (users) of production machines. The factories 102–104 may be those which belong to different manufacturers or to the same manufacturer (e.g., they may be a pre-process factory and a post-process factory). In each factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105 which is an outside network of the factory. With this structure, the host control system 108 of the vendor 101 can be accessed from the LAN 111 in each factory, through the internet 105. Further, due to the security function of the host control system 108, only admitted users can access thereto. More specifically, through the internet 105, status information representing the state of operation of the production machines 106 (for example, the state of the machine in which any disorder has occurred) may be transmitted as a notice from the factory to the vendor. Additionally, any response information which is responsive to the notice (that is, for example, information on how the disorder should be treated or software data concerning the treatment) as well as a latest software program and maintenance information such as help information, may be supplied from the vendor. The data communication between each factory 102–104 and the vendor 101 as well as the data communication through the LAN 111 in each factory, may use a communication protocol (TCP/IP) generally used in the internet. In place of using the internet, an exclusive line network (e.g., ISDN) controlled with a strictest security that an access of a third party is not allowed, may be used. Further, the host control system is not limited to the system as provided by the vendor. A database may be structured by the user and it may be set in an outside network, such that it can be accessed from plural user factories.

Figure 6:
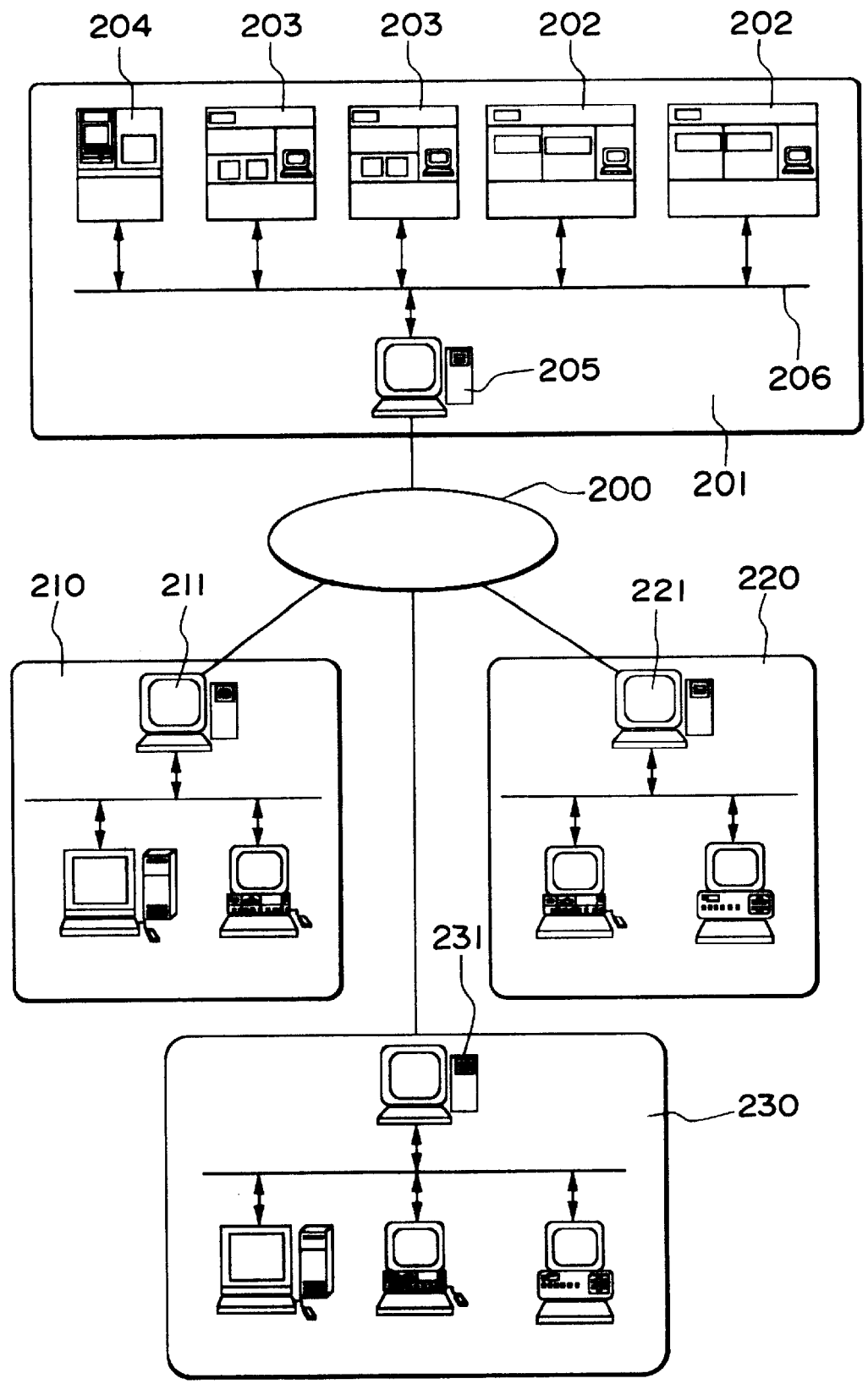
FIG. 6 is a schematic view of a general structure of another example of a semiconductor device manufacturing system.

FIG. 6 is a schematic view of a general structure of the production system according to this embodiment, in another aspect thereof different from that of FIG. 5. In the preceding example, plural user factories each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 201, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet. The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 200. Therefore, the suspension of the production line is short.

Figure 7:
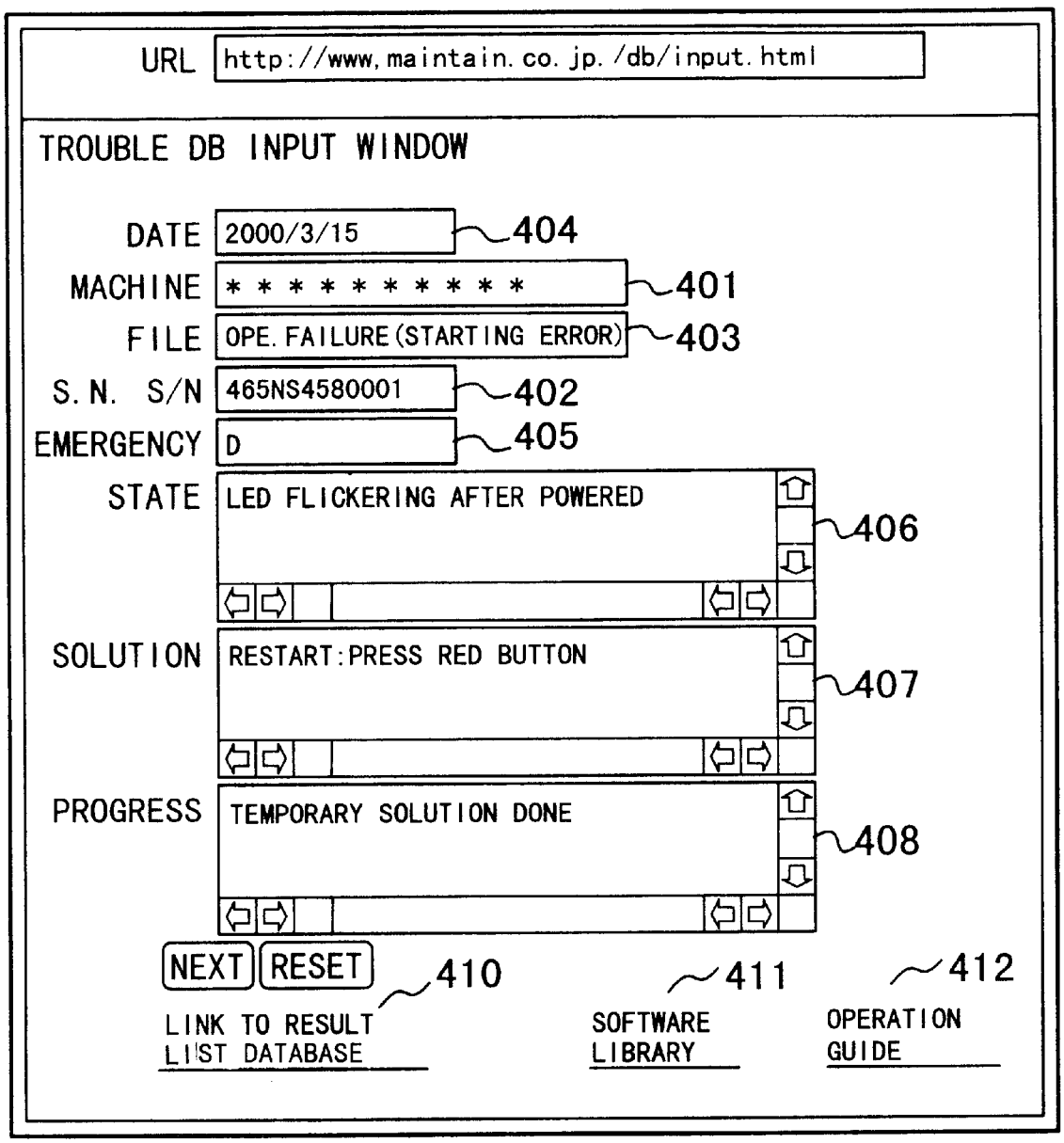
FIG. 7 is a schematic view of an example of a user interface in an input picture plane of a trouble database.

Each of the production machines in the factory may have a display, a network interface and a computer for executing network accessing software, stored in a storage device, as well as machine operating software. The storage device may be an internal memory or a hard disk or, alternatively, it may be a network file server. The network accessing software may include an exclusive or wide-use web browser, and a user screen interface such as shown in FIG. 7, for example, may be provided on the display. Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user's display. Further, the user interface as provided by the web browser enables a hyperlink function (410–412) as illustrated. As a result, the operator can access further details of information in each item, or he/she can get a latest version software to be used for the production machine, from the software library as provided by the vendor. Alternatively, the operator can get an operation guide (help information) prepared for factory operators.

Next, a semiconductor device manufacturing process, which uses the production system described above, will be explained.

Figure 8:
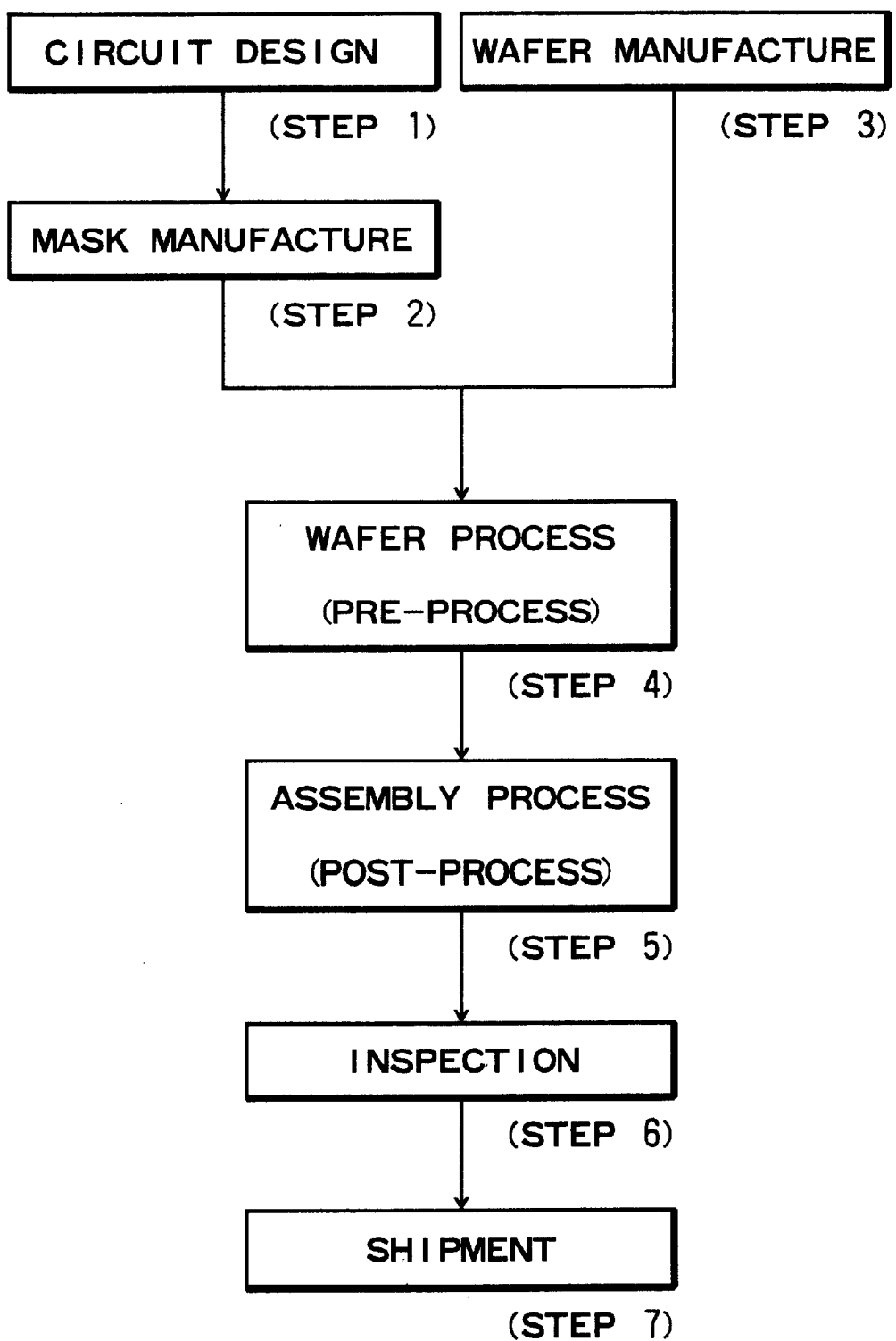
FIG. 8 is a flow chart of semiconductor device manufacturing processes.

FIG. 8 is a flow chart of a general procedure for the manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

Figure 9:
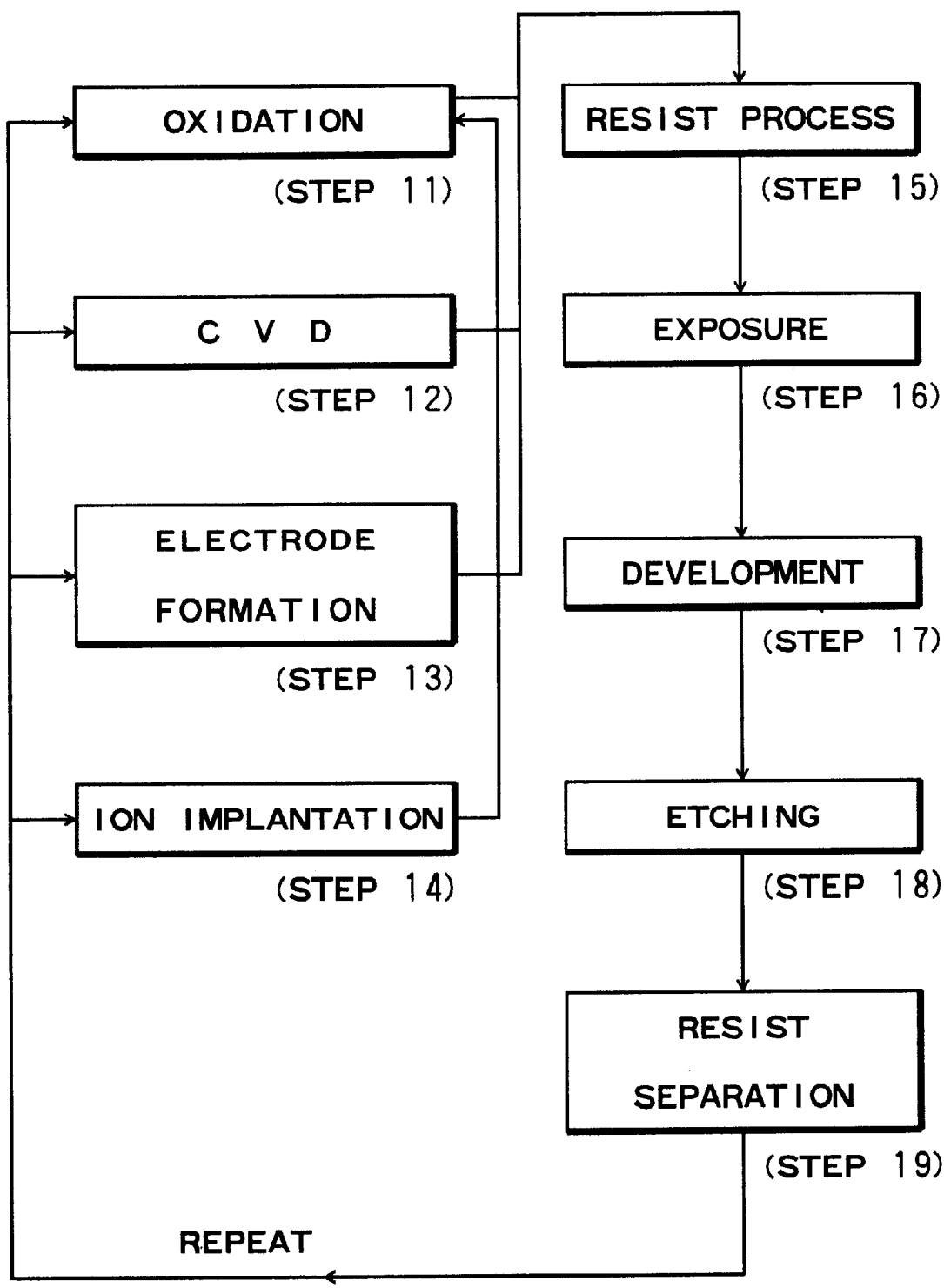
FIG. 9 is a flow chart of a wafer process.
Figure 10A:
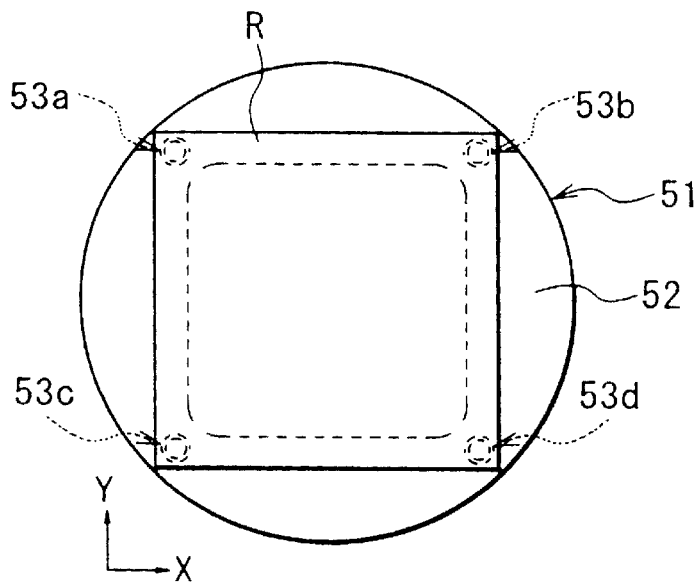
Figure 10B:
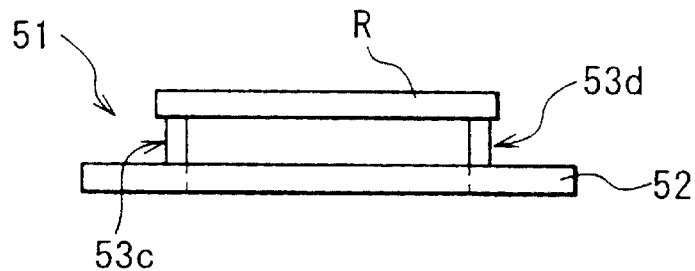
Figure 10C:
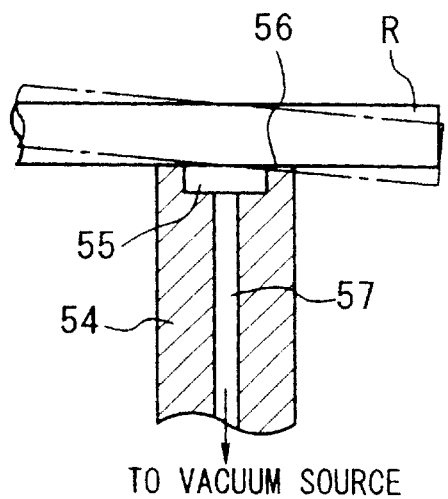
Figure 11A:
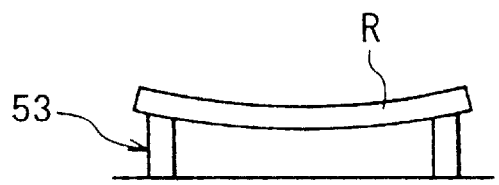
FIGS. 11A–11D are schematic views for explaining various states of deformation produced in an original, due to the shape of an attracting face, in the conventional original chuck.
Figure 11B:
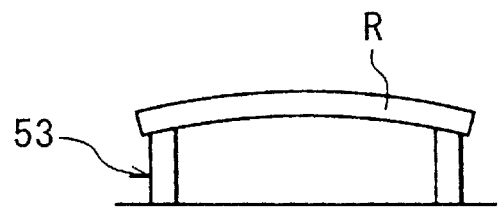
Figure 11C:
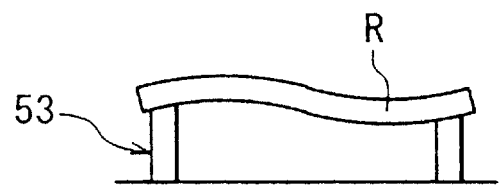
Figure 11D:
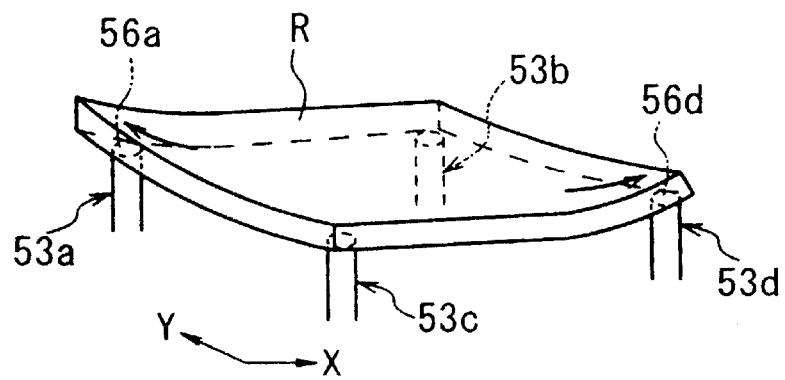
Figure 12A:
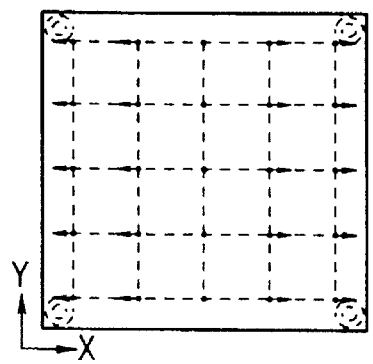
FIGS. 12A–12D are schematic views for explaining distortions of original patterns, resulting from various states of deformation of the original.
Figure 12B:
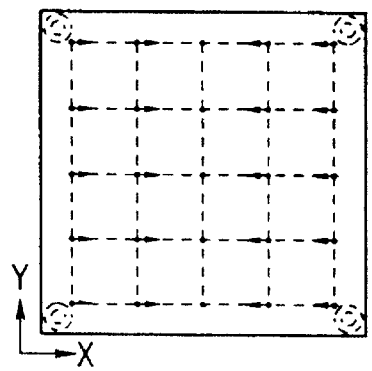
Figure 12C:
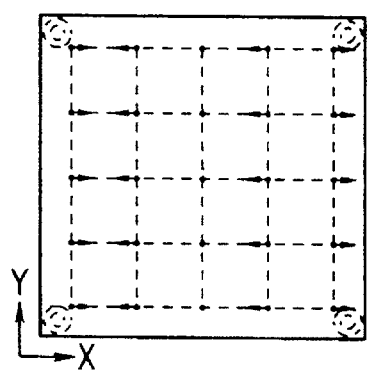
Figure 12D:
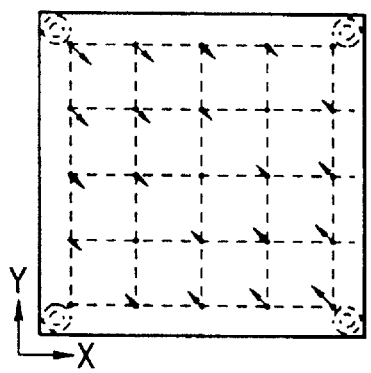

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

In accordance with the embodiments of the present invention as described hereinbefore, any deformation of an original to be produced when the same is held can be prevented, such that distortion of a pattern of the original resulting from the deformation or distortion of a pattern transferred to a substrate such as a wafer can be avoided. Therefore, an error in the pattern overlay or an error in the junction of patterns, which is otherwise caused by the deformation of the original, can be reduced significantly. As a result, the yield of products can be improved. Further, when the exposure process is based on the mix and match method, the throughput can be improved.

While the invention has been described with reference to the structures disclosed herein, it is not confined to the details set forth and this application is intended to cover such modifications or changes as may come within the purposes of the improvements or the scope of the following claims.

What is claimed is:

1. An original chuck for holding an original, said original chuck comprising:

a plurality of attracting and holding portions for holding the original, each of said plurality of attracting and holding portions having a supporting member for supporting the original with point contact, and an attracting pad of an elastic material for surrounding said supporting member; and an adjusting mechanism for adjustably moving at least one of said attracting and holding portions in a direction orthogonal to a supporting surface of a respective supporting member.

2. An original chuck according to claim 1, wherein said adjusting mechanism includes one of a piezoelectric device, and electrostrictive device and a magnetostrictive device.

3. An original chuck according to claim 1, wherein each of said attracting and holding portions includes a contact member to be brought into contact with the original, and wherein said contact member has a spherical shape.

4. An original chuck according to claim 3, wherein each of said attracting and holding portions has an attracting pad for surrounding said contact member, said attracting pad being made of an elastic material and being effective to attract the original.

5. An original chuck according to claim 1, wherein a portion of each supporting member to be in contact with the original has a spherical shape.

6. An exposure apparatus, comprising:
an original chuck comprising (i) a plurality of attracting and holding portions for holding the original, each of said plurality of attracting and holding portions having a supporting member for supporting the original with point contact, and an attracting pad of an elastic material for surrounding said supporting member and (ii) an adjusting mechanism for adjustably moving at least one of said attracting and holding portions in a direction orthogonal to a supporting surface of a respective supporting member; and
exposure means for transferring a pattern of the original, held by said original chuck, onto a substrate by exposure.

7. An exposure apparatus according to claim 6, further comprising a display, a network interface, and a computer for executing a network accessing software program, such that data transmission for performing maintenance information related to said exposure apparatus can be performed through a computer network.

8. An exposure apparatus according to claim 7, wherein said network accessing software program provides, on said display, a user interface for accessing a maintenance database provided by one of a vendor and a user of said exposure apparatus, such that information can be obtained from said database through an internet connected to the computer network or an exclusive line network.

9. A semiconductor device manufacturing method, comprising the steps of:
setting a group of production machines in a semiconductor manufacturing factory, the production machines including an exposure apparatus that includes (1) an original chuck, the original chuck including (i) a plurality of attracting and holding portions for holding the original, each of the plurality of attracting and holding portions having a supporting member for supporting the original with point contact, and an attracting pad of an elastic material for surrounding the supporting member and (ii) an adjusting mechanism for adjustably moving at least one of the attracting and holding portions in a direction orthogonal to a supporting surface of a respective supporting member, and (2) exposure means for transferring a pattern of the original, held by the original chuck, onto a substrate by exposure; and
producing semiconductor devices through the performance of plural processes using the production machine group.

10. A semiconductor device manufacturing method according to claim 9, further comprising connecting the production machines in the group with each other by a local area network, and performing data communication related to at least one of the production machines of the group, between the local area network and one of an exclusive line network and an internet, being an exterior network outside the semiconductor manufacturing factory.

11. A semiconductor device manufacturing method according to claim 10, wherein the data communication enables that a database which is provided by one of a manufacturer of semiconductor devices and a vendor of a semiconductor production machine is accessed through the exterior network to obtain maintenance information related to the production machine.

12. A semiconductor device manufacturing method according to claim 10, wherein the data communication is made between the semiconductor manufacturing factory and another semiconductor manufacturing factory through the external network, for production control.

* * * * *